(12) United States Patent
Foster et al.

(10) Patent No.: US 7,498,222 B1
(45) Date of Patent: Mar. 3, 2009

(54) ENHANCED ETCHING OF A HIGH DIELECTRIC CONSTANT LAYER

(75) Inventors: John C. Foster, Mountain View, CA (US); Scott Bell, San Jose, CA (US); Allison Holbrook, San Jose, CA (US); Simon S. Chan, Saratoga, CA (US); Phillip Jones, Fremont, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 343 days.

(21) Appl. No.: 11/371,024

(22) Filed: Mar. 9, 2006

(51) Int. Cl.
*H01L 21/336* (2006.01)

(52) U.S. Cl. .................. 438/261; 438/287; 438/288; 438/705; 438/745; 257/E21.246; 257/E21.625; 257/E21.681

(58) Field of Classification Search ................. 438/261, 438/287, 288, 705, 745; 257/E21.246, E21.625, 257/E21.681
See application file for complete search history.

(56) References Cited

U.S. PATENT DOCUMENTS

| | | | |
|---|---|---|---|
| 6,468,865 B1 * | 10/2002 | Yang et al. | 438/262 |
| 7,132,370 B2 * | 11/2006 | Paraschiv et al. | 438/756 |
| 2006/0001058 A1 * | 1/2006 | Dreeskornfeld et al. | 257/288 |

* cited by examiner

*Primary Examiner*—George Fourson
(74) *Attorney, Agent, or Firm*—Harrity & Harrity, LLP

(57) ABSTRACT

A high K layer, such as aluminum oxide or hafnium oxide, may be formed with a deposition process that uses an ion implantation to damage portions of the high K material that are to be later etched. More particularly, in one implementation, a semiconductor device is manufactured by forming a first dielectric over a substrate, forming a charge storage element over the first dielectric, forming a second dielectric above the charge storage element, implantation ions into select portions of the second dielectric, and etching the ion implanted select portions of the second dielectric.

15 Claims, 10 Drawing Sheets

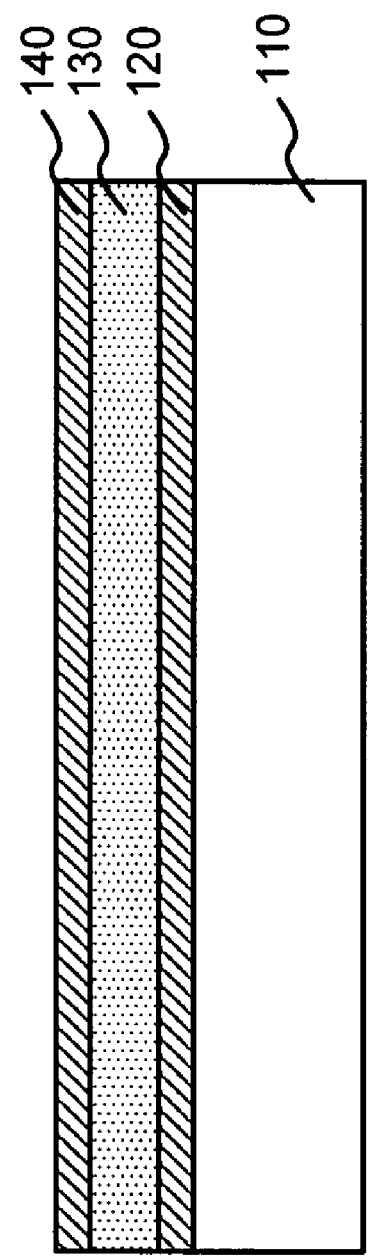

ENHANCED ETCHING OF A HIGH DIELECTRIC CONSTANT LAYER

TECHNICAL FIELD

The present invention relates generally to methods of manufacturing semiconductor devices. The invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology.

One type of conventional electrically erasable programmable read only memory (EEPROM) device includes a silicon substrate with an oxide-nitride-oxide (ONO) stack formed on the substrate. A silicon control gate is formed over the ONO stack. This type of memory device is often referred to as a SONOS (silicon-oxide-nitride-oxide-silicon) type memory device. In a SONOS device, the nitride layer acts as the charge storage layer.

The SONOS type memory device may be programmed by a hot electron injection process that injects electrons into the nitride layer where they become trapped. The nitride layer may then store this negative charge.

The SONOS type memory device is typically erased using a hot hole injection (HHI) process. In some SONOS type memory devices, the oxide layer on the nitride layer may be augmented or replaced with a high K material. The addition of the high K material permits the SONOS memory device to be erased using mechanisms other than HHI. For example, Fowler-Nordheim (FN) erase mechanisms may be used.

DISCLOSURE OF THE INVENTION

Implementations consistent with the invention provide a non-volatile memory device, such as an EEPROM, that includes a layer having a high dielectric constant (K) value (e.g., a K value greater than silicon dioxide (3.9)) formed over the charge storage layer. The high K layer may be formed with a process that uses an ion implantation step to damage the crystalline structure of the portion of the high K material that is to be etched away.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

One aspect of the invention is directed to a method of manufacturing a semiconductor device. The method includes forming a first dielectric over a substrate, forming a charge storage element over the first dielectric, forming a second dielectric above the charge storage element, implanting ions into select portions of the second dielectric, etching the ion implanted select portions of the second dielectric, and forming a control gate over the non-etched portions of the second dielectric.

Another aspect of the invention is directed to a method of patterning a first dielectric layer. The method includes forming the first dielectric layer over a second dielectric layer; patterning a mask to cover portions of the first dielectric layer; implanting ions into the first dielectric layer, the ion implantation damaging portions of the first dielectric layer not covered by the mask; and etching the mask and the damaged portions of the first dielectric layer.

Yet another aspect of the invention is directed to a method of forming a semiconductor device. The method includes forming a first dielectric over a substrate, forming a charge storage element over the first dielectric, forming a second dielectric above the charge storage element, and forming a third dielectric on the second dielectric, the third dielectric having a higher dielectric constant than the second dielectric. The method further includes forming a mask that covers first portions of the third dielectric and leaves open second portions of the third dielectric and performing an ion implantation step designed to damage a crystalline structure of the second portions of the third dielectric. The method further includes etching the ion implanted third dielectric and the mask to expose the first portions of the third dielectric and remove the second portions of the third dielectric and forming a control gate over the first portions of the third dielectric.

BRIEF DESCRIPTION OF THE DRAWINGS

Reference is made to the attached drawings, wherein elements having the same reference number designation may represent like elements throughout.

FIG. 1A is a cross-section illustrating exemplary layers used to form a charge storage structure in a semiconductor device.

BEST MODE FOR CARRYING OUT THE INVENTION

Figure 1B:
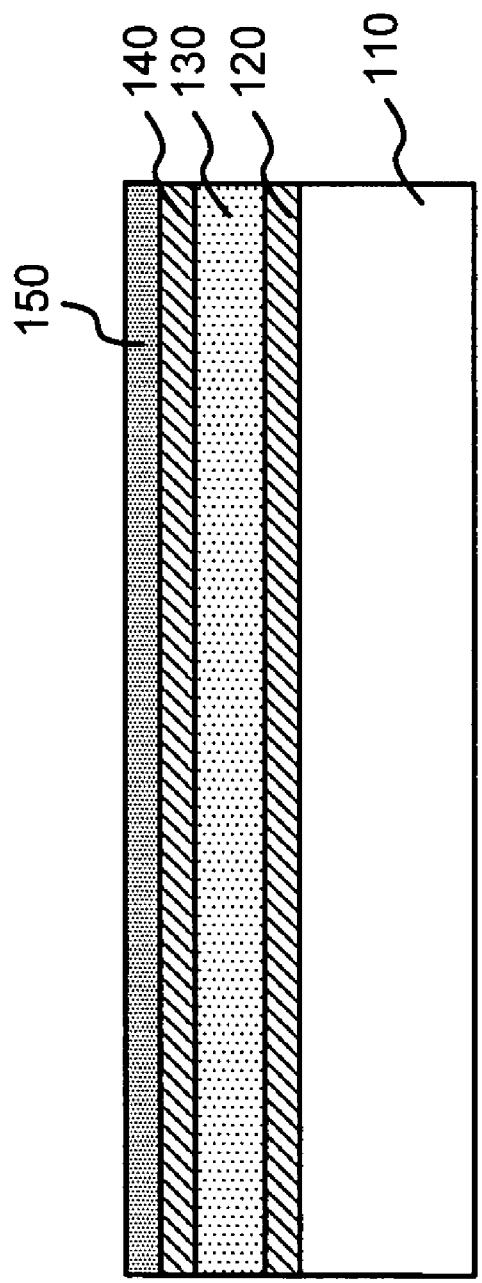
FIG. 1B is a cross-section illustrating the formation of a high K dielectric on the device of FIG. 1A.

FIG. 1A illustrates the cross-section of a semiconductor device 100 formed in accordance with an embodiment of the invention. Referring to FIG. 1A, semiconductor device 100 may include layers 110, 120, 130 and 140. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from about 15 Å to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride). Layer 130 may act as a charge storage layer for semiconductor device 100 and may have a thickness ranging from about 20 Å to about 100 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., $SiO_2$). Layer 140 may include another dielectric material, such as a silicon oxynitride, that may be deposited or thermally grown on layer 130. In still other alternatives, layer 140 may be a composite that includes a number of dielectric layers or films. Layer 140 may have a thickness ranging from about 15 Å to about 100 Å and may function as an inter-gate dielectric for memory cells in semiconductor device 100.

A high K dielectric layer 150 may be formed on layer 140, as illustrated in FIG. 1B. In an exemplary embodiment, dielectric layer 150 may have a thickness ranging from about 30 Å to about 200 Å. Dielectric layer 150 may function as an inter-gate dielectric (along with layer 140). High K dielectric layer 150 may also function to prevent back gate injection problems associated with erasing a memory cell.

In an exemplary embodiment, dielectric layer 150 may include an aluminum oxide (e.g., $Al_2O_3$). In some implementations, other high K materials may be used in place of, or in conjunction with, the aluminum oxide. For example, hafnium oxide (e.g., $HfO_2$) or $HfSi_xO_y$ may be used. Dielectric layer 150 may be deposited using an atomic layer deposition (ALD) process or a chemical vapor deposition (CVD) process.

Figure 1C:
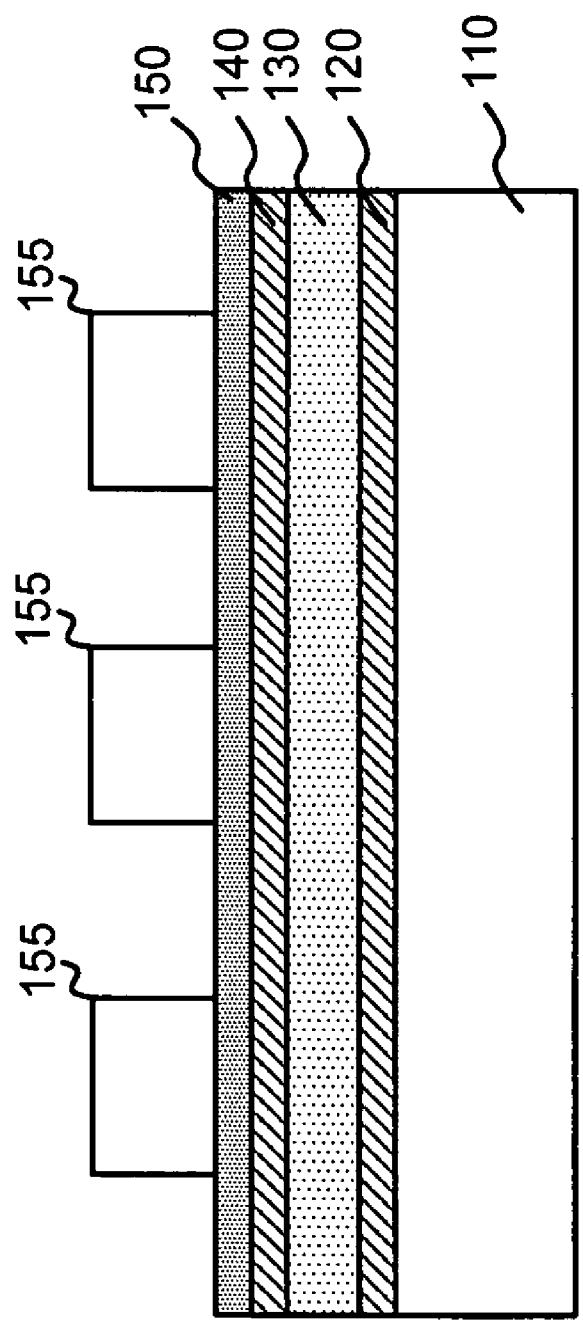
FIG. 1C is a cross-section illustrating the patterning of a photoresist material of the device in FIG. 1B.

Semiconductor device 100 may next be patterned to define portions of layer 150 that will be used for the individual memory cells. As shown in FIG. 1C, a photoresist material may be patterned and etched to form masks 155 on the top surface of high K dielectric layer 150. Each of masks 155 may be associated with a subsequently formed memory cell.

Figure 1D:
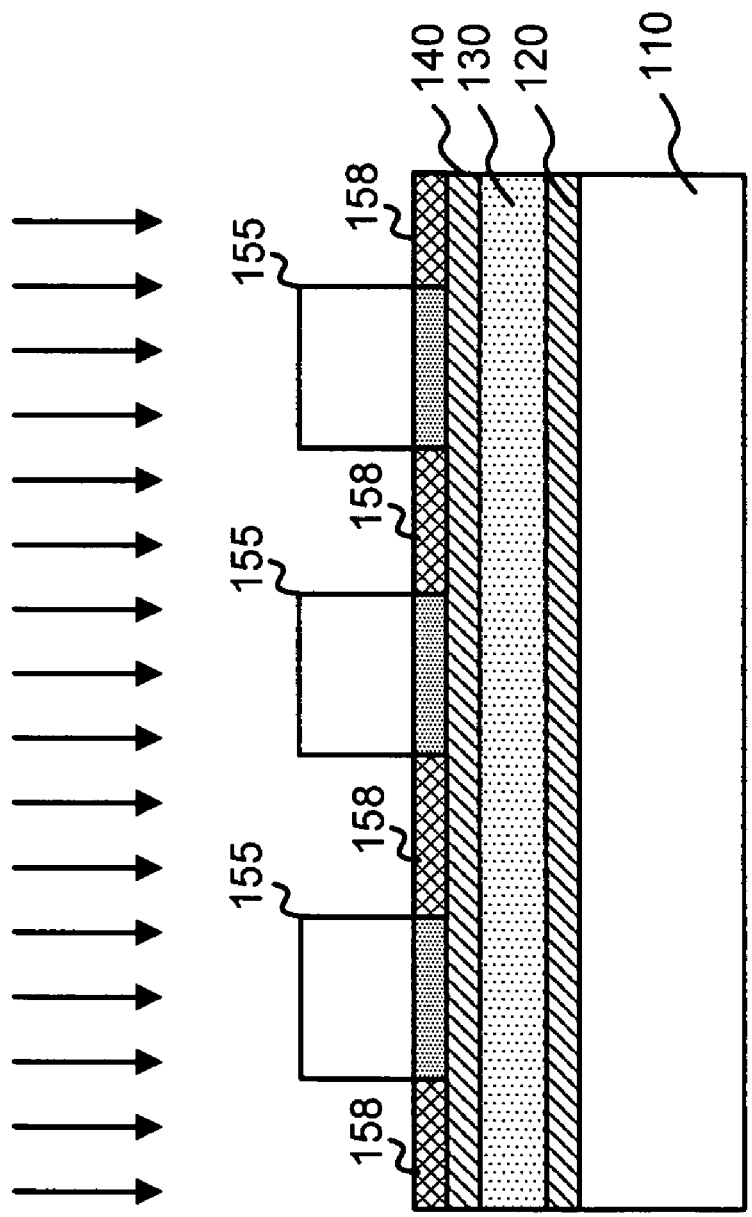
FIG. 1D is a cross-section illustrating ion implantation of the device in FIG. 1C.

As shown in FIG. 1D, ion implantation may next be performed on mask areas 155 and the exposed areas of dielectric layer 150. The ion implantation may be performed with, for example, n-type impurities, such as phosphorous or arsenic, or p-type impurities, such as boron or $BF_2$, or even non-dopant species such as Ar or Si. The implantation tends to damage the crystalline form of the deposited high K layer 150. The ion implanted portions of layer 150 are shown in FIG. 1D with cross-hatching as ion implanted areas 158. In an exemplary implementation, impurities may be implanted at a dosage of about $5 \times 10^{14}$ atoms/$cm^2$ to about $1 \times 10^{16}$ atoms/$cm^2$ and an implantation energy ranging from about 5 keV to about 100 keV. It has been found that such implantation dosages and energies sufficiently damage the crystalline structure of high K areas 158 to facilitate easy removal of these areas 158, as described below.

Figure 1E:
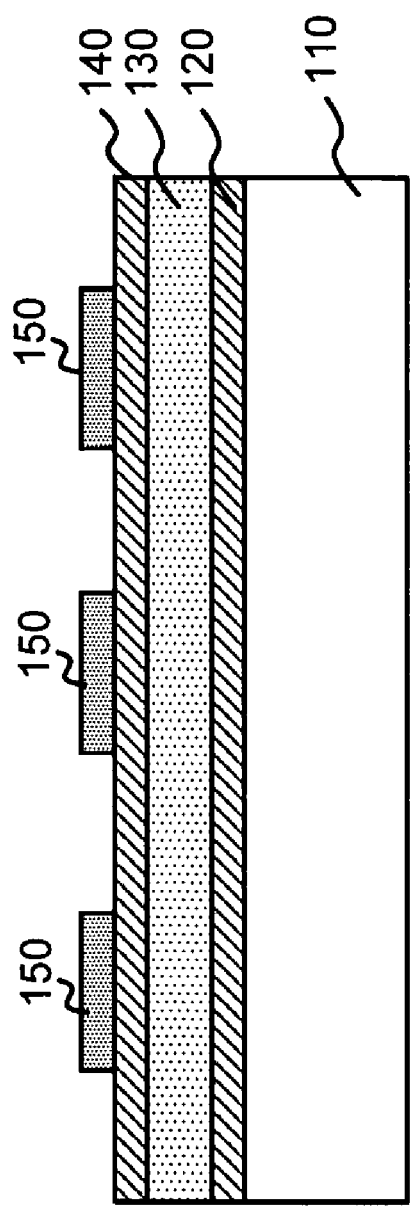
FIG. 1E is a cross-section illustrating the device shown in FIG. 1D after etching.

Semiconductor device 100 may then be etched. In one implementation, mask areas 155 may be etched simultaneously with the etching of ion-implanted areas 158. That is, a single etchant, such as a sulfuric acid/hydrogen peroxide ($H_2O_2$) mixture, may be applied to semiconductor device 100 in to remove ion-implanted areas 158 and mask areas 155. In an exemplary implementation, the etching may be performed for a duration of about 1 minute to about 15 minutes, depending on the thickness of layer 150. Because the ion-implanted areas 158 have a damaged crystalline structure due to the ion implantation, these areas are more easily removed than if they were not ion implanted. That is, the wet etching removes masks 155 and areas 158 without damaging other portions of layer 150 or layer 140. Accordingly, the resultant structure, as shown in FIG. 1E, may include masked portions of high K layer 150 disposed on dielectric layer 140.

Figure 1F:
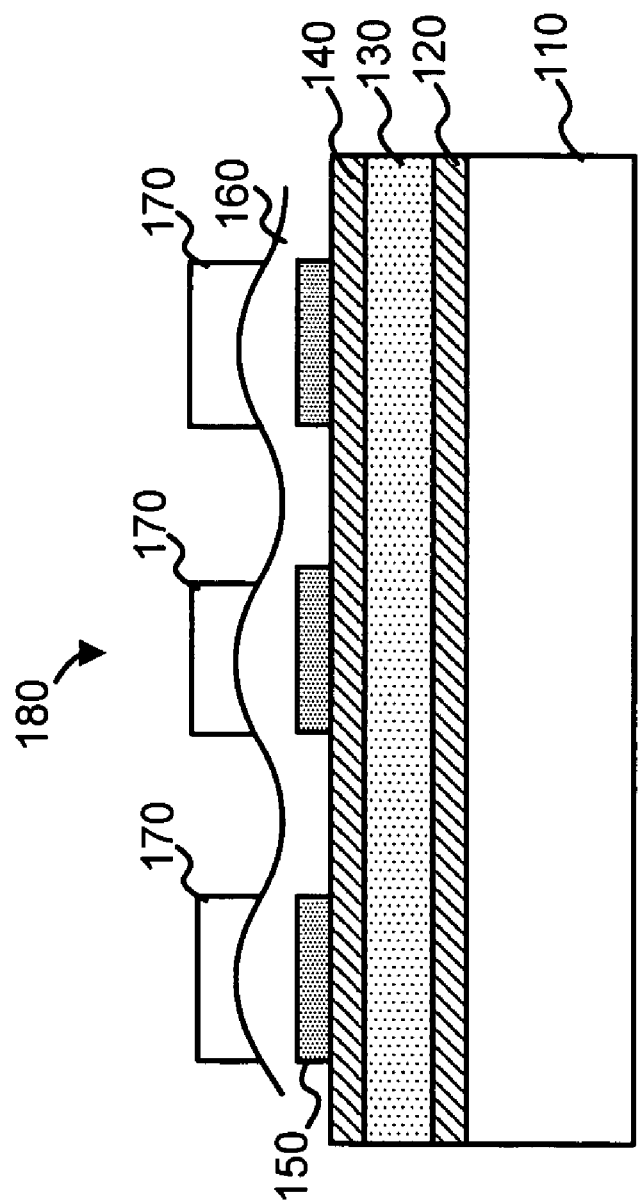
FIG. 1F is a cross-section illustrating formation of a polycrystalline material and a mask material on the device shown in FIG. 1E.

A conductive layer 160, such as polycrystalline silicon, may be formed on dielectric layer 150, as illustrated in FIG. 1F. Alternatively, conductive layer 160 may include other semiconducting materials, such as germanium or silicon-germanium, or various metals, such as titanium or tungsten. In an exemplary implementation, conductive layer 160 may have a thickness ranging from about 500 Å to about 2000 Å. Conductive layer 160, consistent with the invention, may be used to form the control gate electrodes for the memory cells in semiconductor device 100.

A photoresist material may be patterned and etched to form masks 170 on the top surface of conductive layer 160, as is also illustrated in FIG. 1F. Masks 170 may be used to facilitate formation of one or memory cells in semiconductor device 100. A portion of one particular memory cell is illustrated in FIG. 1F as memory cell 180. An optional planarization step may be performed to planarize the upper surface of conductive layer 160 prior to forming masks 170.

Figure 2:
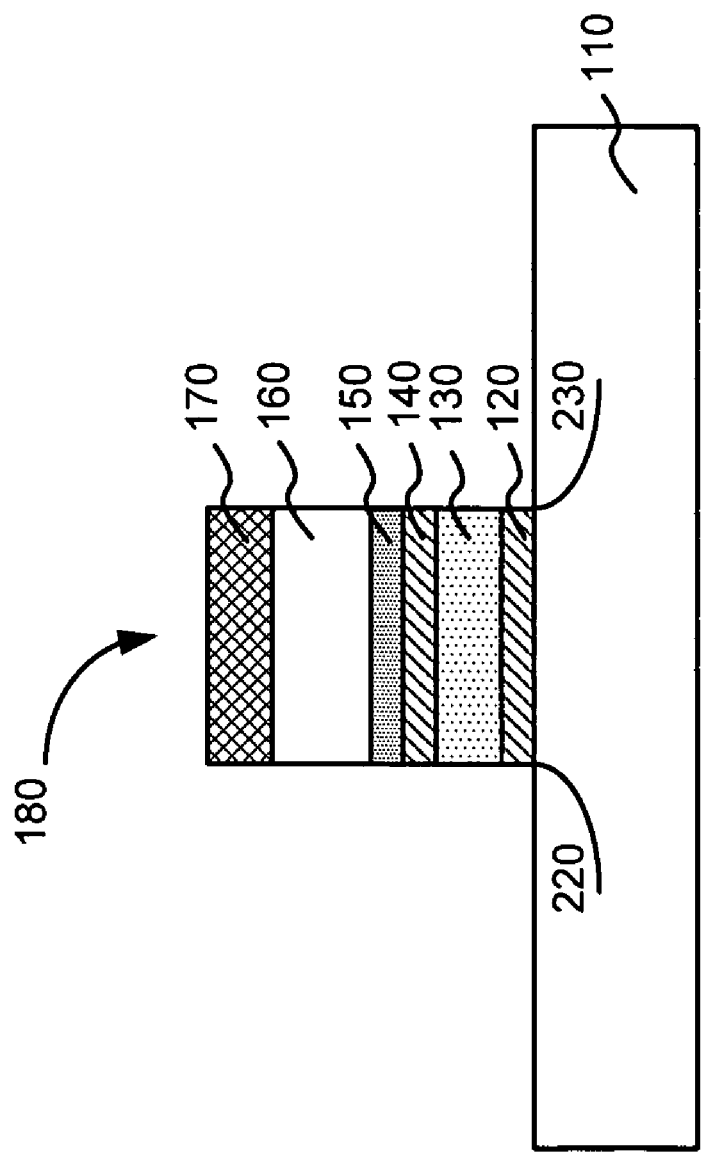
FIG. 2 is a cross-section illustrating the formation of a memory cell in accordance with an embodiment of the invention.

FIG. 2 is a cross-section illustrating memory cell 180 after another etching process. In particular, referring to FIG. 2, layers 120-160 may be etched in a conventional manner with the etching terminating at substrate 110, thereby forming memory cell 180. Alternatively, the etching may terminate at layer 150, followed in some implementations by additional etching to form memory cell 180. Memory cell 180 may represent a memory cell of semiconductor device 100, where the memory cell 180 includes a dielectric layer 120, a charge storage layer 130, an inter-gate dielectric layer 140, a high K dielectric layer 150 and a control gate electrode 160. As suggested in FIGS. 1A through 1F, semiconductor device 100 may typically include a memory array including a large number of memory cells 180.

In an exemplary implementation consistent with the invention, each memory cell 180 includes an aluminum-oxide-nitride-oxide (AONO) structure. That is, each memory cell 180 may include an aluminum oxide layer 150 formed on an oxide-nitride-oxide (ONO) stack (i.e., layers 140, 130 and 120), with nitride layer 130 acting as a charge storage layer. The AONO stack may be formed on substrate 110 and a control gate electrode 160 may be formed over the AONO stack.

Source and drain regions 220 and 230 may then be formed in substrate 110, as illustrated in FIG. 2. For example, n-type impurities, such as phosphorous or arsenic may be implanted in substrate 110 to form source and drain regions 220 and 230, based on the particular end device requirements. Alternatively, a p-type dopant, such as boron, may be implanted in substrate 110 to form source and drain regions 220 and 230. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
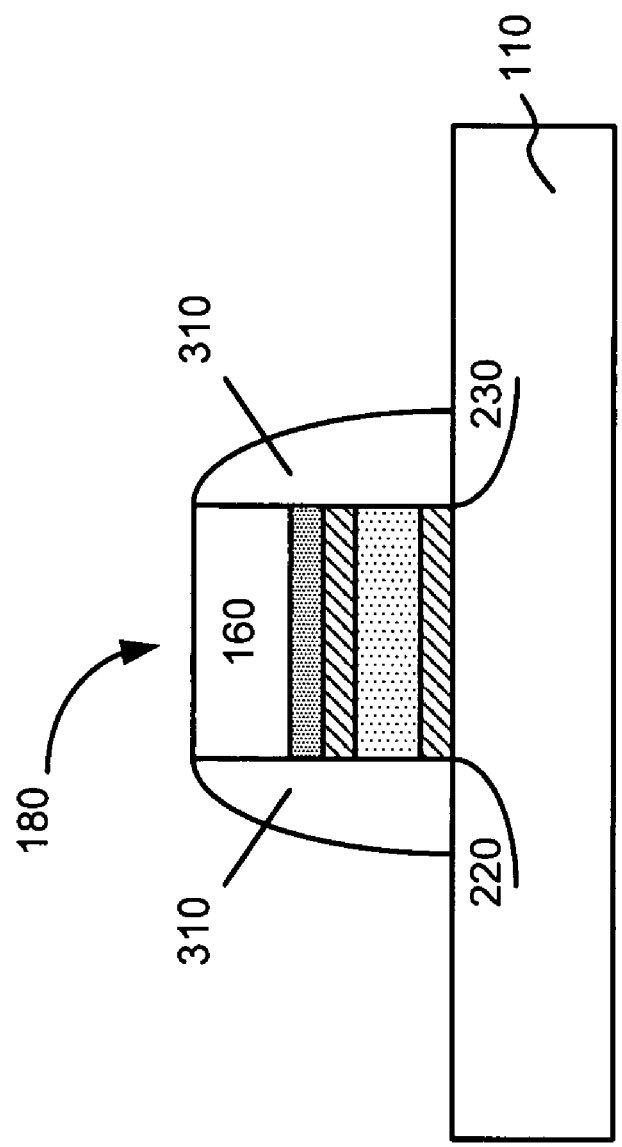
FIG. 3 is a cross-section illustrating the formation of spacers and source and drain regions for the device of FIG. 2.

Photoresist masks 170 may then be removed using a conventional process. Spacers 310 may then be formed adjacent the sidewalls of the memory cells 180, as illustrated in FIG. 3. For example, a dielectric material, such as a silicon oxide, a silicon oxynitride or another dielectric material, may be deposited and etched to form spacers 310 on each side of memory cell 180, as illustrated in FIG. 3. Spacers 310 may be used to electrically isolate memory cell 180 from adjacent memory cells (not shown). Spacers 310 may also be used to facilitate the deposition of impurities in semiconductor device 100.

Figure 4:
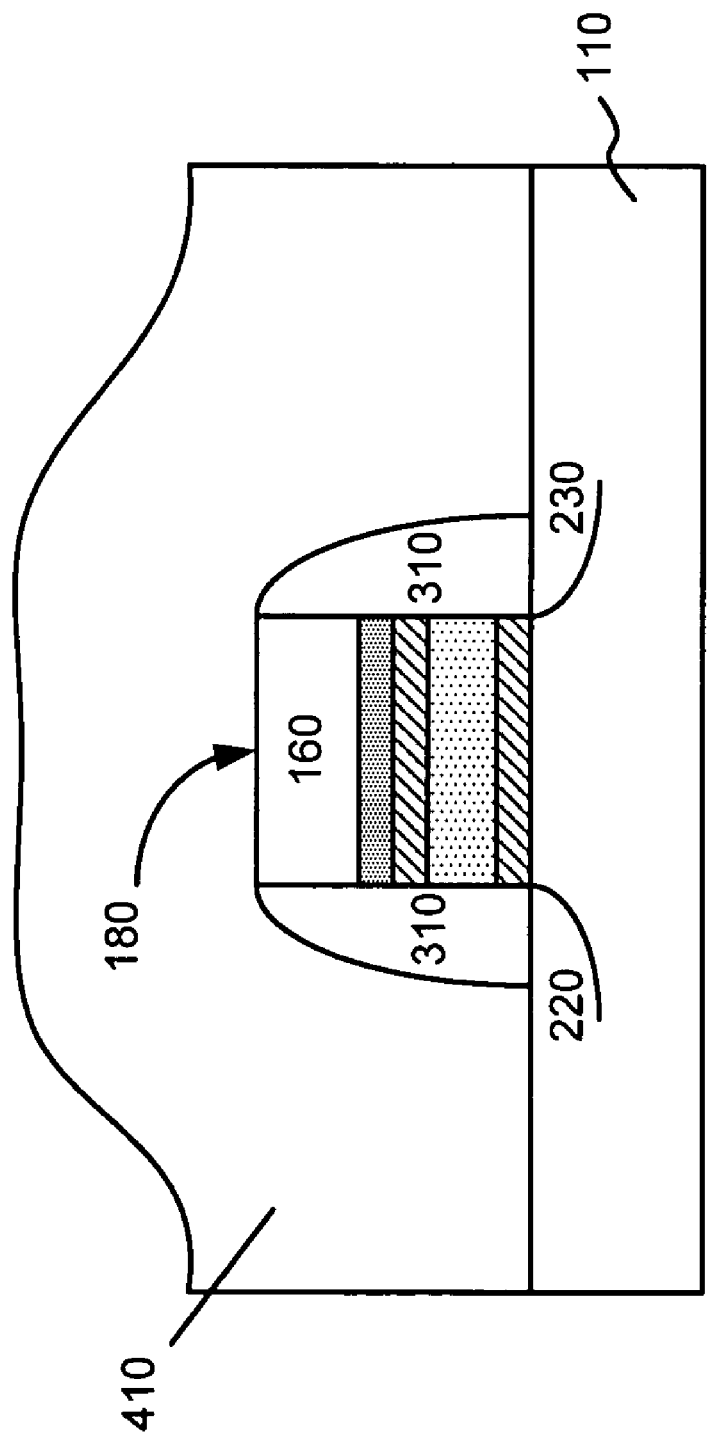
FIG. 4 is a cross-section illustrating the formation of an interlayer dielectric on the device of FIG. 3.

A dielectric layer 410 may then be deposited over semiconductor device 100, as illustrated in FIG. 4. Dielectric layer 410 (also referred to an interlayer dielectric (ILD) 410) may include, for example, a phosphosilicate glass (PSG) material, a boro-phosphosilicate (BSPG) material, an oxide or some other dielectric material.

Figure 5:
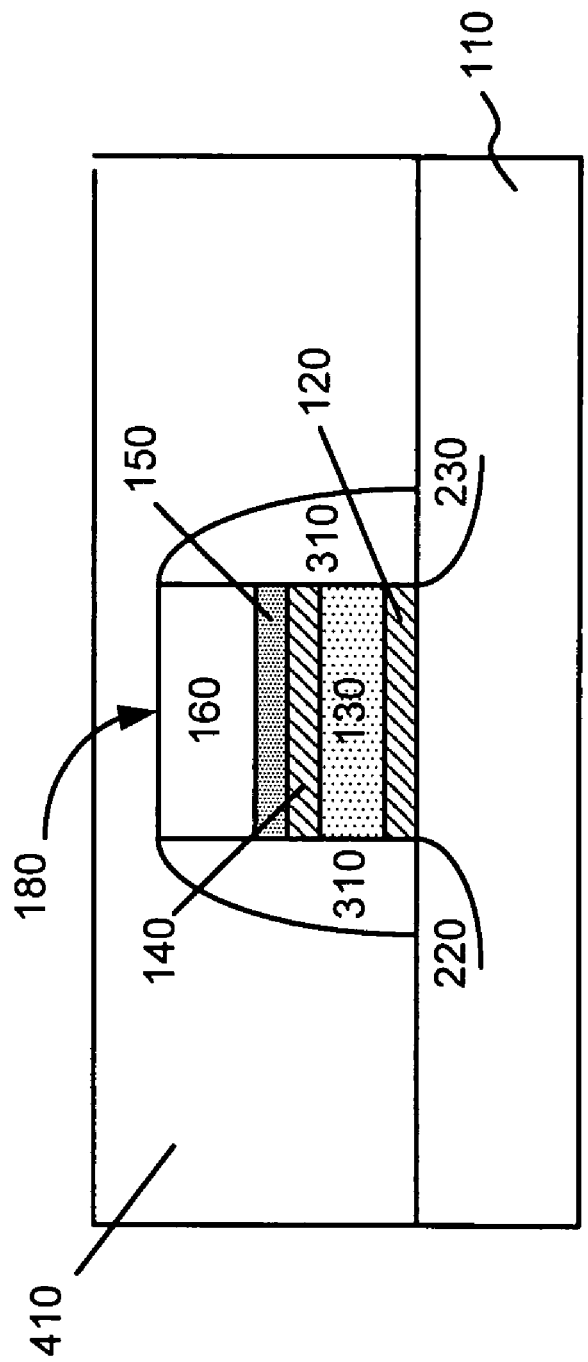
FIG. 5 is a cross-section illustrating the planarization of the interlayer dielectric of FIG. 4.

ILD 410 may optionally be planarized using a conventional process, such as a chemical-mechanical polishing (CMP) process, as illustrated in FIG. 5. Referring to FIG. 5, the CMP process may planarize the top surface of ILD 410 to facilitate formation of subsequent structures, such as interconnect lines. ILD 410 functions to isolate various conductive structures, such as various interconnect lines (not shown), source region 220 or drain region 230 from an external electrode (not shown), etc.

For example, a trench (not shown) may subsequently be formed in ILD 410 using conventional photolithographic and etching technique. The trench may be used to form a contact to, for example, source region 220 or drain region 230. Next, a metal layer, such as copper or aluminum, may be deposited to fill the trench.

An interconnect line may then be formed over the planarized top surface of ILD 410 in FIG. 5. For example, a metal, such as copper or aluminum, may be deposited to form an interconnect that connects various features in semiconductor device 100, such as source or drain regions 220/230 to an external electrode, to facilitate programming or erasing various memory cells 180 in semiconductor device 100.

As described above, in an exemplary embodiment, the resulting semiconductor device 100 illustrated in FIG. 5 includes a control gate electrode 160 formed on an AONO structure (i.e., layers 150, 140, 130 and 120). High K dielectric layer 150 may be formed using an ion implantation process to facilitate etching of portions of layer 150.

Memory cell 180 may be an EEPROM type memory device and one or more programming circuits (not shown) may be used to facilitate programming and erasing of one or more memory cells 180 of semiconductor device 100. Programming of memory cell 180 may be accomplished by applying a voltage of, for example, about 5 volts to 20 volts to control gate 160. Once programmed, electrons remain trapped in nitride layer 130 until an erase procedure is performed.

In an exemplary embodiment, erasing of memory cell 100 may be accomplished by an FN tunneling procedure. For example, erasing of memory cell may be performed by applying a bias of about 5 volts to about 20 volts to control gate electrode 160. In addition, a bias of, for example, about 5 volts to about 20 volts may be applied to source region 220 or drain region 230. During erasing, electrons may tunnel from nitride layer 130 into substrate 110 (e.g., source or drain regions 220/230) via oxide layer 120. Advantageously, aluminum oxide layer 150 prevents or substantially reduces the number of electrons from control gate electrode 160 that may tunnel into nitride layer 130 during the FN erase procedure.

In summary, implementations consistent with the invention form a high K dielectric layer by using an ion implantation step to damage portions of the high K layer. The high K layer may allow a SONOS type memory device to be erased using an FN tunneling type erase procedure.

The description above focuses on a semiconductor memory device 100, such as an EEPROM, that stores one bit of data per memory cell 180. In other implementations, a number of memory cells 180 may be configured to store two bits of data. That is, charge storage layer 130 may be programmed to store two separate charges representing two bits of data by localizing the first and second charges to the respective left and right sides of charge storage layer 130 illustrated in FIG. 5. Each of the two bits of memory cell 180 may be programmed independently by, for example, channel hot electron injection, to store a charge on each respective side of the charge storage layer 130. In this manner, the charges in charge storage layer 130 become effectively trapped on each respective side of charge storage layer 130. Erasing of each bit in memory cell 180 may also be performed independently. During FN erasing, the charges stored in charge storage layer 130 may tunnel through dielectric layer 120 into the source region 220 and drain region 230, respectively.

In this manner, the density of the resulting memory array in semiconductor device 100 may be increased as compared to conventional memory devices that store only one bit of data per cell.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed:

1. A method of manufacturing a semiconductor device, comprising:

forming a first dielectric over a substrate;
forming a charge storage element over the first dielectric;
forming a second dielectric above the charge storage element;
forming a high K dielectric above the second dielectric;
forming a mask over portions of the high K dielectric;
performing an ion implantation onto select portions of the high K dielectric to damage the select portions of the high K dielectric;
simultaneously etching the ion implanted select portions of the high K dielectric and the mask; and
forming a control gate over the non-etched portions of the high K dielectric.

2. The method of claim 1, further comprising:
forming a third dielectric between the charge storage element and the second dielectric.

3. The method of claim 1, wherein the high K dielectric includes aluminum oxide and the second dielectric includes silicon oxide.

4. The method of claim 1, wherein the high K dielectric includes a material having a dielectric constant higher than silicon oxide.

5. The method of claim 1, wherein the ion implantation of the select portions of the high K dielectric is performed to damage the crystalline structure of the select portions of the high K dielectric.

6. The method of claim 1, wherein the charge storage element comprises a nitride.

7. The method of claim 1, wherein the high K dielectric includes hafnium oxide or aluminum oxide.

8. A method of patterning a first dielectric layer comprising:
forming the first dielectric layer over a second dielectric layer;
patterning a mask to cover portions of the first dielectric layer;
implanting ions into the first dielectric layer at a dosage of about $5\times10^{14}$ atoms/cm$^2$ to about $1\times10^{16}$ atoms/cm$^2$ and an implantation energy ranging from about 5 keV to about 100 keV, the ions damaging portions of the first dielectric layer not covered by the mask; and
simultaneously etching the mask and the damaged portions of the first dielectric layer.

9. The method of claim 8, wherein the first dielectric layer includes at least one of aluminum oxide or hafnium oxide.

10. The method of claim 8, wherein the implanting ions damage the portions of the first dielectric layer by damaging a crystalline structure of the first dielectric layer.

11. The method of claim 8, wherein the second dielectric layer comprises a silicon oxide and the first dielectric layer comprises aluminum oxide.

12. A method of forming a semiconductor device comprising:
forming a first dielectric over a substrate;
forming a charge storage element over the first dielectric;
forming a second dielectric above the charge storage element;
forming a third dielectric on the second dielectric, the third dielectric having a higher dielectric constant than the second dielectric;
forming a mask that covers first portions of the third dielectric;
performing an ion implantation to damage a crystalline structure of second portions of the third dielectric not covered by the mask;
wet etching, using a sulfuric acid hydrogen peroxide mixture, the ion implanted third dielectric and the mask to expose the first portions of the third dielectric and remove the second portions of the third dielectric; and
forming a control gate over the first portions of the third dielectric.

13. The method of claim 12, wherein the third dielectric includes aluminum oxide.

14. The method of claim 12, wherein the third dielectric includes hafnium oxide.

15. The method of claim 12, wherein the etching does not damage the second dielectric.

\* \* \* \* \*